(12) United States Patent
Peuser et al.

(10) Patent No.: US 9,705,493 B2
(45) Date of Patent: Jul. 11, 2017

(54) PROTECTION APPARATUS, METHOD AND POWER SUPPLY SYSTEM

(71) Applicant: Robert Bosch GmbH, Stuttgart (DE)

(72) Inventors: Thomas Peuser, Ludwigsburg (DE); Stephan Gase, Tiefenbronn (DE)

(73) Assignee: Robert Bosch GmbH, Stuttgart (DE)

( * ) Notice: Subject to any disclaimer, the term of this patent is extended or adjusted under 35 U.S.C. 154(b) by 491 days.

(21) Appl. No.: 14/365,145

(22) PCT Filed: Nov. 20, 2012

(86) PCT No.: PCT/EP2012/073047
§ 371 (c)(1),
(2) Date: Jun. 13, 2014

(87) PCT Pub. No.: WO2013/092066
PCT Pub. Date: Jun. 27, 2013

(65) Prior Publication Data
US 2014/0312715 A1    Oct. 23, 2014

(30) Foreign Application Priority Data
Dec. 20, 2011 (DE) .................. 10 2011 089 145

(51) Int. Cl.
*H02H 5/12* (2006.01)
*H03K 17/94* (2006.01)
(Continued)

(52) U.S. Cl.
CPC ............. *H03K 17/94* (2013.01); *H02H 1/003* (2013.01); *H02H 5/12* (2013.01); *G01R 31/025* (2013.01)

(58) Field of Classification Search
CPC ...................... H02H 1/003; H02H 5/12
See application file for complete search history.

(56) References Cited

U.S. PATENT DOCUMENTS 6,633,093 B1 * 10/2003 Rim .................. H03K 3/57
307/106
6,906,525 B2 * 6/2005 Suzuki ............... B60L 3/0023
324/509
(Continued)

FOREIGN PATENT DOCUMENTS

BE    EP 1265076 B1 * 12/2008 ......... G01R 31/1272
CN    101101310 A    1/2008
(Continued)

OTHER PUBLICATIONS

International Search Report for Application No. PCT/EP2012/073047 dated Mar. 6, 2013 (English Translation, 3 pages).

*Primary Examiner* — Thienvu Tran
*Assistant Examiner* — Pinping Sun
(74) *Attorney, Agent, or Firm* — Michael Best & Friedrich LLP

(57) ABSTRACT

The present invention discloses a protection apparatus for an IT network having a first and a second live line, having a signal generator which is designed to feed a first signal to the first and/or to the second live line, having a detection device which is designed to detect the profile of the fed first signal in at least one live line, and having a control device which is designed to analyze the detected profile and to output a disconnection signal when the analysis of the detected profile indicates that a living organism is in contact with the first live line and the second live line. The present invention also discloses a method and a power supply system.

16 Claims, 3 Drawing Sheets

(51) Int. Cl.
*H02H 1/00* (2006.01)
*G01R 31/02* (2006.01)

(56) References Cited

U.S. PATENT DOCUMENTS

| | | | | |
|---|---|---|---|---|
| 8,847,605 | B2* | 9/2014 | Morita | B60L 3/0023 |
| | | | | 324/509 |
| 2002/0121902 | A1 | 9/2002 | Suzuki | |
| 2008/0197855 | A1* | 8/2008 | Uchida | G01R 27/025 |
| | | | | 324/509 |
| 2010/0207635 | A1* | 8/2010 | Plagens | B60L 3/0023 |
| | | | | 324/509 |
| 2011/0125354 | A1 | 5/2011 | Gottwick et al. | |
| 2011/0140714 | A1* | 6/2011 | Hernando | G01R 27/025 |
| | | | | 324/551 |
| 2011/0260755 | A1* | 10/2011 | Littow | H02J 7/0008 |
| | | | | 327/58 |
| 2011/0304339 | A1* | 12/2011 | Schumacher | G01R 31/025 |
| | | | | 324/509 |
| 2013/0106437 | A1* | 5/2013 | Herraiz | G01R 31/11 |
| | | | | 324/615 |

FOREIGN PATENT DOCUMENTS

| | | | | |
|---|---|---|---|---|
| DE | 102004018918 | | 7/2005 | |
| EP | 1921457 | | 5/2008 | |
| EP | 2353919 | | 8/2011 | |
| JP | 2004104923 | A | 4/2004 | |
| JP | 2004166380 | | 6/2004 | |
| WO | WO 2007006248 | A1 * | 1/2007 | .......... H02H 1/0015 |
| WO | 2011027010 | | 3/2011 | |

\* cited by examiner

PROTECTION APPARATUS, METHOD AND POWER SUPPLY SYSTEM

BACKGROUND OF THE INVENTION

The present invention relates to a protection apparatus for an IT grid comprising a first and a second live line, to a method and to a power supply system.

Power grids with an electrically isolated ground are used in various technical applications. One possible application for such so-called IT (Isolated Terre) grids is hybrid and electric vehicles.

Although the subject of the present application can be used for a multiplicity of IT grids, it will be described below in connection with IT grids for hybrid or electric vehicles.

In the development of modern motor vehicles, the reduction of the consumption of fuel and therefore also the emission of harmful substances is one of the most important criteria for a development engineer. In order to reduce the fuel consumption of internal combustion engines, these engines can be assisted by an electric motor in hybrid vehicles. In electric vehicles, the internal combustion engine is not assisted by an electric motor but is replaced by the electric motor.

In such hybrid and electric vehicles, a high-voltage energy store, for example a lithium-ion battery, is used in order to store the electrical energy required for the operation of the electric motor. This high-voltage energy is generally transmitted to an inverter via two high-voltage lines, of which one high-voltage line conducts a positive voltage and one high-voltage line conducts a negative voltage.

If such a hybrid or electric vehicle is serviced in a workshop, under certain circumstances the high-voltage lines may be exposed. If, once a service task has been performed on a hybrid or electric vehicle, the high-voltage lines between the battery and the inverter are not properly connected to the inverter, it is possible for a living organism, in particular a person, to touch live parts of the high-voltage lines.

Such a hybrid or electric vehicle is disclosed, for example, in DE 102008001973 A1.

SUMMARY OF THE INVENTION

The present invention discloses a protection apparatus having the features of the invention, a method having the features of the invention and a power supply system having the features of the invention.

Accordingly, provision is made for:

A protection apparatus for an IT grid comprising a first and a second live line, comprising a signal generator, which is designed to feed a first signal into the first and/or the second live line, comprising a detection device, which is designed to detect the characteristic of the fed-in first signal in at least one live line, and comprising a control device, which is designed to analyze the detected characteristic and to output a disconnection signal when the analysis of the detected characteristic indicates that the first live line and the second live line are being touched by a living organism.

A method for protecting living organisms for an IT grid comprising a first and a second live line, said method comprising the steps of feeding a first signal into the first and/or the second live line, detecting the characteristic of the fed-in first signal in the at least one live line, analyzing the detected characteristic and outputting a disconnection signal when the analysis of the detected characteristic indicates that the first live line and the second live line are being touched by a living organism.

A power supply system comprising at least one high-voltage battery, comprising a high-voltage intermediate circuit, which comprises an intermediate circuit capacitor, comprising at least two high-voltage lines, which connect the high-voltage battery to the intermediate circuit capacitor, comprising at least one controllable switching device, which is designed to electrically isolate the two high-voltage lines from the high-voltage battery, comprising a protection apparatus according to the invention, which protection apparatus is coupled at least to one of the high-voltage lines and is designed to actuate the at least one controllable switching apparatus by means of a disconnection signal in such a way that said controllable switching apparatus electrically isolates the two high-voltage lines from the high-voltage battery when it is identified that the live lines are being touched by a living organism.

The knowledge on which the present invention is based consists in that living organisms have a frequency-dependent impedance, and this frequency-dependent impedance can be used to identify whether a living organism is touching the live lines of an IT grid.

The concept on which the present invention is based now consists in taking into consideration this knowledge and providing a protection apparatus for IT grids which tests the live lines of the IT grid for the presence of impedance which is characteristic of a living organism and outputs a disconnection signal if such an impedance which is characteristic of a living organism is identified in the live lines of the IT grid.

For this purpose, the present invention provides that a first signal is fed into the live lines and, on the basis of the characteristic of the signal within the live lines, it is identified whether a living organism is touching the live lines. The first signal which is reflected and/or changed on the basis of impedance within the live lines is also understood to mean the characteristic of the signal within the live lines.

In this case, any signal which makes it possible to detect the impedance within the live lines over a predetermined frequency spectrum is suitable as first signal. In this case, the predetermined frequency spectrum has at least those frequencies which make it possible to identify a characteristic impedance of a living organism.

In one embodiment, the signal generator comprises a controllable voltage source and/or a controllable current source. In addition, the first signal is a voltage pulse or a current pulse. If a controllable voltage source or a controllable current source is used in order to generate a voltage pulse or a current pulse as first signal, very flexible matching of the voltage protection apparatus to different application cases is possible.

In a further embodiment, the signal generator comprises a coil comprising a switching element, wherein the switching element is designed to connect the coil to a voltage source and to isolate the coil from the voltage source in order to generate the first signal in the form of a voltage pulse. If a coil is used as signal generator, a very simple design of the signal generator and therefore a very simple design of the protection apparatus is made possible.

In a further embodiment, the detection device comprises a voltage sensor, which is designed to detect a voltage in the at least one live line, and/or a current sensor, which is designed to detect a current intensity in the at least one live line. If, in order to detect the characteristic of the first signal, according to the invention the characteristic of the voltage and/or the characteristic of the current within the live lines is detected, the impedance in the live lines can be detected very easily over the predetermined frequency spectrum.

In a further embodiment, the control device comprises an analog-to-digital converter, which is designed to convert the detected voltage and/or the detected current intensity into a digital value which is characteristic of the detected voltage and/or the detected current intensity. This makes it possible to further-process the characteristic of the detected voltage and/or the detected current intensity in a program-controlled apparatus, for example a microcontroller.

In a further embodiment, the control device has a memory, which is designed to store a multiplicity of digital values which are characteristic of the characteristic of the fed-in first signal in the at least one live line, wherein the control device comprises a transformation device, which is designed to implement a transform into the frequency range, in particular a fast Fourier transform, for the stored characteristic over time of the fed-in first signal and to output data which characterize the characteristic of the fed-in first signal in the frequency range. In addition, the control device comprises an evaluation device, which is designed to identify, in the stored data, those frequencies at which the impedance of the live lines has local maxima or minima and to output the disconnection signal when at least one of the identified frequencies is in at least one predetermined frequency range for identification of a living organism.

If a transformation of the signal characteristic into the time range is performed, it is very easily possible to analyze the frequency-dependent impedance within the live lines. Since the frequency-dependent impedance of living organisms at certain frequencies has minima or maxima, it is possible to identify very easily within the frequency range whether the characteristic frequency-dependent impendence of a living organism is present in the signal characteristic. As a result, it is possible to very reliably output a disconnection signal using simple calculations.

The above configurations and developments can be combined with one another as desired, if expedient. Further possible configurations, developments and implementations of the invention also include combinations of features of the invention which have been described previously or are described below in respect of the exemplary embodiments, which combinations are not explicitly mentioned. In particular, in this case a person skilled in the art will add individual aspects as improvements or additions to the respective principle of the present invention.

BRIEF DESCRIPTION OF THE DRAWINGS

The present invention will be explained in more detail below with reference to the exemplary embodiments set forth in the schematic figures of the drawings, in which.

Identical or functionally identical elements and apparatuses, where not specified otherwise, have been provided with same reference symbols in all of the figures.

DETAILED DESCRIPTION

Figure 1:
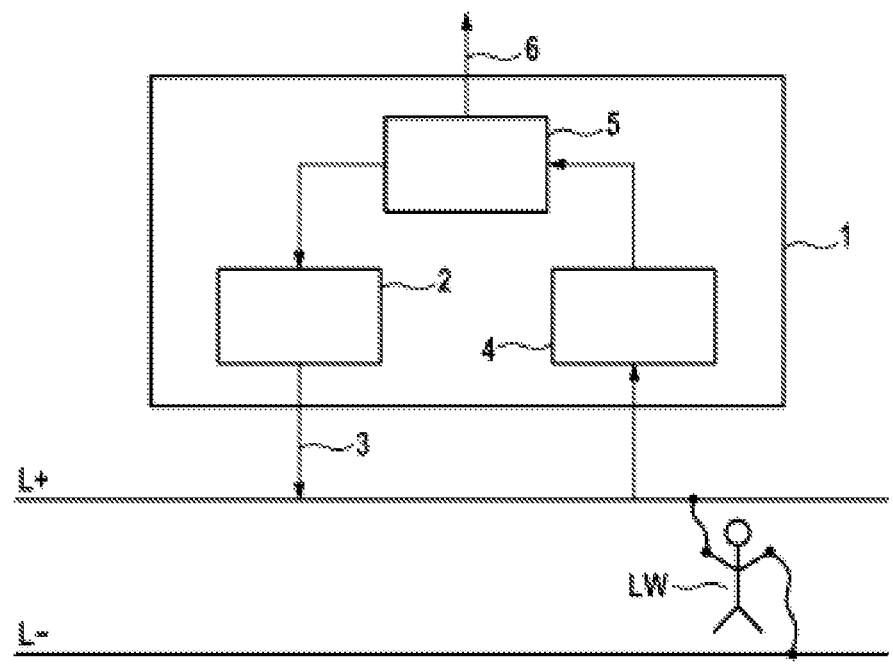
FIG. 1 shows a block diagram of an embodiment of a protection apparatus 1 according to the invention.

FIG. 1 shows a block diagram of an embodiment of a protection apparatus 1 according to the invention.

The protection apparatus 1 in FIG. 1 comprises a signal generator 2, which is coupled to a control device 5 and which is controlled by the control device 5. In addition, the protection apparatus 1 comprises a detection device 4, which is designed to detect a characteristic of a signal in the live lines L+, L− and to provide this signal to the control device 5. In addition, the control device 5 is designed to output a disconnection signal 6.

Finally, FIG. 1 comprises two live lines L+, L− of an IT grid, each of which lines is touched by a hand of a living organism LW, which is represented in the form of a stick man LW. The signal generator 2 is coupled to the live line L+ in order to feed a first signal 3 into said line, and the detection device 4 is coupled to the live line L+ in order to detect the characteristic of the fed-in signal in the live line L+.

The control device 5 in FIG. 1 is in the form of a microcontroller 5, which runs a computer program product which provides the desired functionality. In further embodiments, the control device 5 can be in the form of an application-specific integrated circuit 5 or the like.

In yet further embodiments, the control device 5 comprises a CAN bus interface or a FlexRay interface, via which the control device 5 can transmit data relating to the identification of a living organism to a further vehicle control device. As a result, for example, further actions can be initiated in the vehicle, such as, for example, the initiating of an emergency call or the disconnection of the internal combustion engine.

Figure 2:
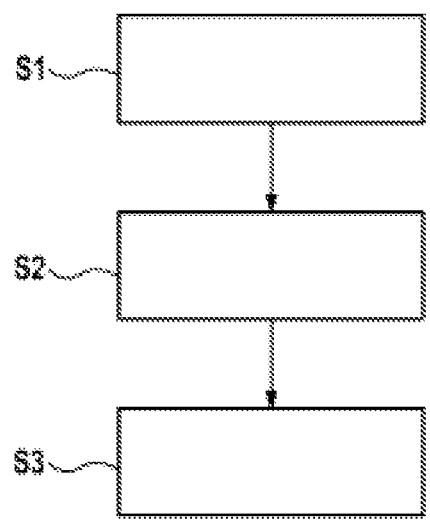
FIG. 2 shows a flow chart of an embodiment of a method according to the invention.

FIG. 2 shows a flow chart of an embodiment of a method according to the invention.

In a first step S1, a first signal 3 is fed into the first and/or the second live line L+, L−. In a second step S2, the characteristic of the fed-in first signal 3 in the at least one live line L+, L− is detected. Finally, in a third step S3, the detected characteristic is analyzed and a disconnection signal 6 is output when the analysis of the detected characteristic indicates that the first live line L+ and the second live line L− are being touched by a living organism LW.

Figure 3:
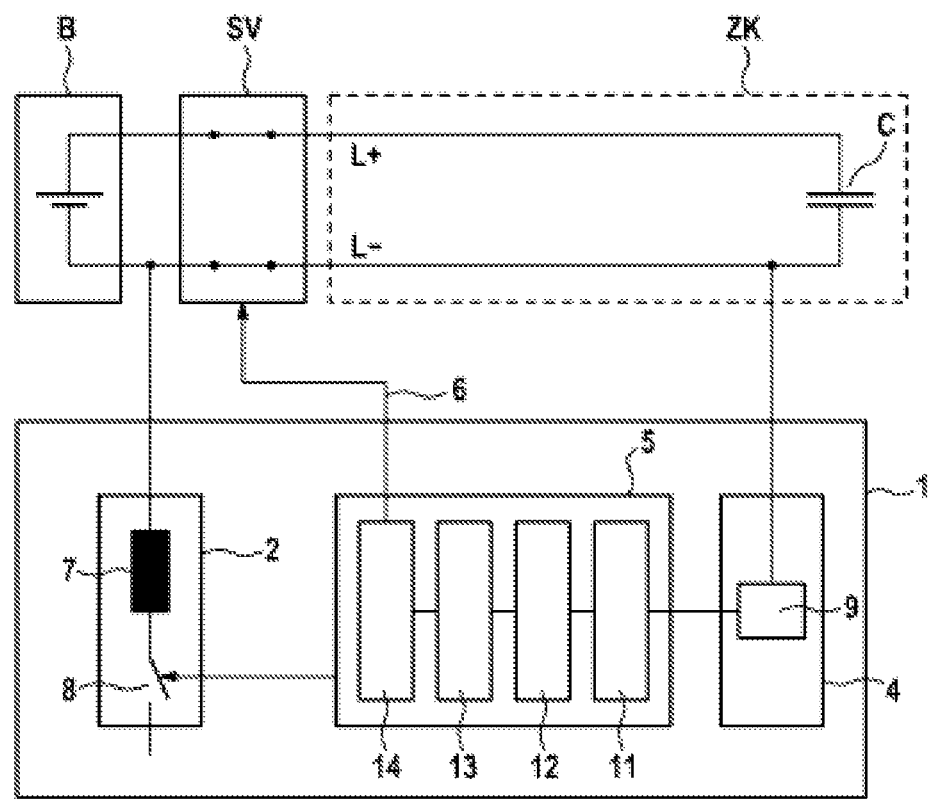
FIG. 3 shows a block diagram of an embodiment of a power supply system according to the invention.

FIG. 3 shows a block diagram of an embodiment of a power supply system according to the invention.

The power supply system in FIG. 3 comprises a battery B, which is coupled electrically to a contactor SV via two live lines L+, L−, which contactor is designed to interrupt the two live lines. The contactor is coupled to a capacitor of a high-voltage intermediate circuit via the two live lines L+, L−.

In addition, FIG. 3 comprises a protection apparatus 1, which is coupled to the high-voltage intermediate circuit ZK.

In contrast to FIG. 1, the signal generator 2 in FIG. 3 comprises a coil 7 and a switching element 8, which is designed to couple the coil 7 to a voltage source (not shown) and to isolate the coil 7 from the voltage source, and which is controlled by the control device 5. The isolation of the coil 7 from the voltage source results in, owing to the inductance of the coil 7, a voltage pulse being fed into the line L− of the power supply system.

Figure 4:
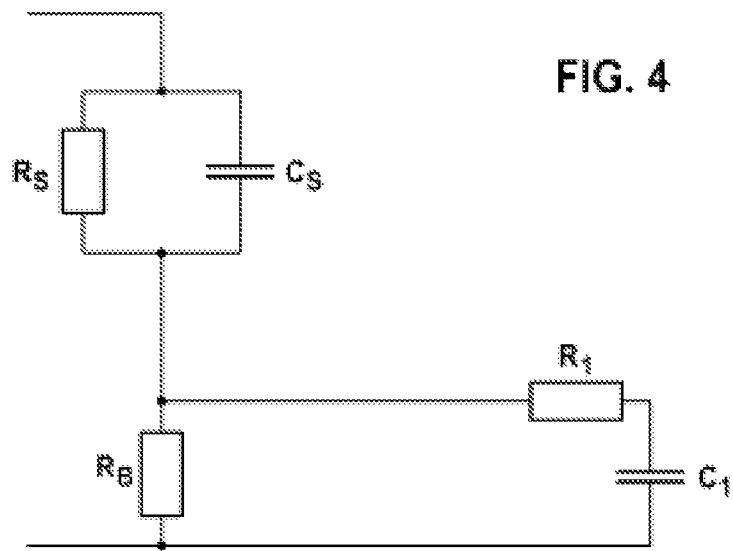
FIG. 4 shows a circuit diagram illustrating the electrical equivalent circuit of a human.

In addition, the detection device 4 in FIG. 4 comprises a voltage and current sensor 9, which is designed to detect values for the voltage and values for the current intensity in the live line L− and to provide the detected values to the control device 5. The control device 5 has an analog-todigital converter 11 in order to digitize the values detected by the voltage sensor and current sensor 9. The digitized values are thereupon stored in a memory 12 in order to store the characteristic of the voltage and the characteristic of the current intensity in the live line L−. A transformation device 13 thereupon transforms the stored characteristics from the time range into the frequency range. This is performed in particular by means of a fast Fourier transform. Finally, the evaluation device 14 analyzes the transformed characteristics in the frequency range and identifies those frequencies at which the impedance of the live lines has local minima. The evaluation device 14 is further designed to output the disconnection signal 6 when at least one of the identified frequencies is in at least one predetermined frequency range for identification of a living organism LW. If the disconnection signal 6 is output, the contactor SV isolates the two live lines L+, L−. from the battery B.

The predetermined frequency range can be between 0 Hz and 1 MHz. If a human is intended to be identified as the living organism, the frequency range can be in particular between 1 kHz and 100 kHz.

In this case, the impedance is calculated according to Ohm's Law in accordance with the formula $Z=U/I$.

In further embodiments, the detection device 4 can comprise a shunt resistor or a contactless current sensor.

FIG. 4 shows a circuit diagram illustrating the electrical equivalent circuit of a human.

The equivalent circuit for a human, as illustrated in FIG. 4, is prescribed by the standard IEC 60850, IEC 61010.

The equivalent circuit comprises a parallel circuit comprising a resistor Rs and a capacitor Cs and, in series therewith, a resistor Rb, with a resistor R1 in series with a capacitor C1 being connected in parallel with said resistor Rb.

In accordance with the standard IEC 60850, IEC 61010, the resistor Rs has a resistance value of 1 kohm, the capacitor Cs has a capacitance of 0.22 µF, the resistor Rb has a resistance value of 500 ohms, the resistor R1 has a resistance value of 10 kohms, and the capacitor C1 has a capacitance of 0.022 µF.

On the basis of this equivalent circuit diagram, it is possible to calculate the frequency at which the equivalent circuit has a minimum impedance. This frequency corresponds to the resonant frequency of the illustrated equivalent circuit diagram and therefore also to the resonant frequency of the human body.

Figure 5:
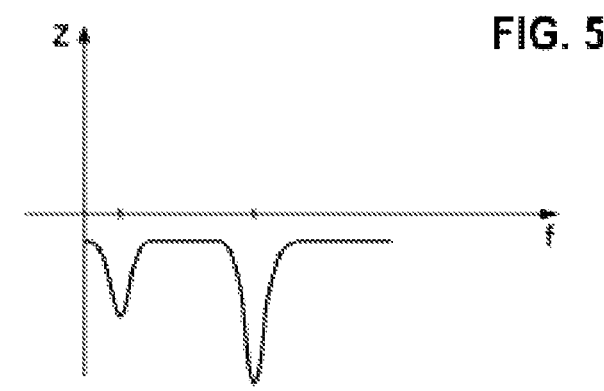
FIG. 5 shows a graph illustrating a frequency-dependent impedance.

FIG. 5 shows a graph illustrating a frequency-dependent impedance.

In the basic graph shown in FIG. 5, an impedance Z is plotted on the y axis. The frequency is plotted on the x axis of the graph. In the graph, an impedance curve is also plotted, which impedance curve has a characteristic from 0 Hz up to approximately 1 MHz at a high impedance determined by parasitic effects. The impedance curve has, for an exemplary design, a first minimum, for example at the frequency 1 kHz of approximately 0.4 ohm and a second minimum, which is much less pronounced, of around 30 kHz, for example.

The frequency at which the first minimum occurs, corresponds to the resonant frequency of the resonant circuit comprising the intermediate circuit capacitor C and the parasitic resistances between the battery B and the intermediate circuit capacitor C.

The frequency at which the second minimum of the impedance curve occurs, corresponds to the resonant frequency of the equivalent circuit illustrated in FIG. 4. Merely the presence of the second minimum makes it possible for the evaluation device to establish that a living organism is touched in the two live lines L+, L−. The absolute value of the impedance at this frequency is not critical.

Although the present invention has been described above with reference to preferred exemplary embodiments, it is not restricted to these exemplary embodiments, but can be modified in a variety of ways. In particular, the invention can be altered or modified in various ways without departing from the essence of the invention.

The invention claimed is:

1. A protection apparatus for an IT grid comprising a first and a second live lines,
   comprising a signal generator, which is designed to feed a first signal into at least one of the first and the second live lines;
   comprising a detection device, which is designed to detect the characteristic of the fed-in first signal in at least one live line; and
   comprising a control device, which is designed to analyze the detected characteristic and to output a disconnection signal when the analysis of the detected characteristic indicates that the first live line and the second live line are being touched by a living organism;
   wherein the control device has a memory, which is designed to store a multiplicity of digital values which are characteristic of the fed-in first signal in the at least one live line;
   wherein the control device comprises a transformation device, which is designed to implement a transform into the frequency range for the stored characteristic over time of the fed-in first signal and to output data which characterize the characteristic of the fed-in first signal in the frequency range: and
   wherein the control device comprises an evaluation device, which is designed to identify, in the output data, those frequencies at which the impedance of the live lines has local maxima or minima and to output the disconnection signal when at least one of the identified frequencies is in at least one predetermined frequency range for identification of the living organism.

2. The protection apparatus as claimed in claim 1, wherein the signal generator comprises a controllable voltage source, and the first signal is a voltage pulse.

3. The protection apparatus as claimed in claim 1, wherein the detection device comprises a current sensor, which is designed to detect a current intensity in the at least one live line.

4. The protection apparatus as claimed in claim 3, wherein the control device comprises an analog-to-digital converter, which is designed to convert the detected current intensity into a digital value which is characteristic of the detected current intensity.

5. A power supply system comprising at least one high-voltage battery, comprising a high-voltage intermediate circuit, which comprises an intermediate circuit capacitor;
   comprising at least two high-voltage lines, which connect the high-voltage battery to the intermediate circuit capacitor;
   comprising at least one controllable switching device, which is designed to electrically isolate the two high-voltage lines from the high-voltage battery;
   comprising a protection apparatus as claimed in claim 1, which protection apparatus is coupled at least to one of the high-voltage lines and is designed to actuate the at least one controllable switching apparatus by a disconnection signal in such a way that said controllable switching apparatus electrically isolates the two high-voltage lines from the high-voltage battery when it is identified that the live lines are being touched by a living organism.

6. The protection apparatus as claimed in claim 1, wherein the signal generator comprises a controllable current source, and the first signal is a current pulse.

7. The protection apparatus as claimed in claim 1, wherein the signal generator comprises a coil comprising a switching element, wherein the switching element is designed to connect the coil to a voltage source and to isolate the coil from the voltage source in order to generate the first signal in the form of a voltage pulse.

8. The protection apparatus as claimed in claim 1, wherein the detection device comprises a voltage sensor, which is designed to detect a voltage in the at least one live line.

9. The protection apparatus as claimed in claim 8, wherein the control device comprises an analog-to-digital converter, which is designed to convert the detected voltage into a digital value which is characteristic of the detected voltage.

10. A method for protecting living organisms for an IT grid comprising a first and a second live lines, said method comprising the following steps:
    feeding a first signal into at least one of the first and the second live lines; detecting the characteristic of the fed-in first signal in the at least one live line;
    analyzing the detected characteristic and outputting a disconnection signal when the analysis of the detected characteristic indicates that the first live line and the second live line are being touched by a living organism;
    converting the detected characteristic into a digital value:
    wherein a multiplicity of digital values which are characteristic of the fed-in first signal in the at least one live line are stored:
    wherein, for the stored characteristic over time of the fed-in first signal, a transform into the frequency range is implemented, and data which characterize the characteristic of the fed-in first signal in the frequency range are output: and
    wherein, in the output data, those frequencies at which the impedance of the live lines has local maxima or minima are identified, and the disconnection signal is output when at least one of the identified frequencies is in at least one predetermined frequency range for identification of the living organism.

11. The method as claimed in claim 10, wherein a current pulse is generated by a controllable current source, and said current pulse is fed as the first signal into at least one live line.

12. The method as claimed in claim 10, wherein a voltage in the at least one live line is detected.

13. The method as claimed in claim 10, wherein a current pulse is generated by a controllable current source, and said current pulse is fed as the first signal into at least one live line.

14. The method as claimed in claim 10, wherein a switching element connects a coil to a voltage source and isolates the coil from the voltage source in order to generate the first signal in the form of a voltage pulse.

15. The method as claimed in claim 10, wherein a current intensity in the at least one live line is detected.

16. The method as claimed in claim 15, wherein the detected current intensity is converted into a digital value which is characteristic of the detected current intensity.

* * * * *